United States Patent
Iino

(10) Patent No.: US 11,835,855 B2
(45) Date of Patent: Dec. 5, 2023

(54) IMPRINT APPARATUS, IMPRINT METHOD, AND METHOD OF MANUFACTURING ARTICLE

(71) Applicant: CANON KABUSHIKI KAISHA, Tokyo (JP)

(72) Inventor: Satoshi Iino, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/391,336

(22) Filed: Aug. 2, 2021

(65) Prior Publication Data

US 2022/0043338 A1 Feb. 10, 2022

(30) Foreign Application Priority Data

Aug. 7, 2020 (JP) ................. 2020-135069

(51) Int. Cl.
    *G03F 7/00* (2006.01)
(52) U.S. Cl.
    CPC ................. *G03F 7/0002* (2013.01)
(58) Field of Classification Search
    CPC ............ G03F 7/0002; B29C 2043/585; B29C 2043/5858; B29C 59/00
    USPC ................................ 425/385, 149
    See application file for complete search history.

(56) References Cited

U.S. PATENT DOCUMENTS

| | | | |
|---|---|---|---|
| 9,594,301 B2 | 3/2017 | Hayashi | |
| 2019/0212645 A1* | 7/2019 | Kusaka | ................. G03F 7/0002 |
| 2019/0366620 A1 | 12/2019 | Kusaka | |

FOREIGN PATENT DOCUMENTS

| | | |
|---|---|---|
| JP | 2013102132 A | 5/2013 |
| JP | 2019212674 A | 12/2019 |

* cited by examiner

*Primary Examiner* — S. Behrooz Ghorishi
*Assistant Examiner* — John W Hatch
(74) *Attorney, Agent, or Firm* — ROSSI, KIMMS & McDOWELL LLP

(57) ABSTRACT

An imprint apparatus that performs an imprint process of forming a pattern on a shot region of a substrate using a mold is provided. The apparatus comprises a mold holder for holding the mold, and a deformation mechanism for deforming a pattern region of the mold held by the mold holder. Based on a response property of the mold when the force is applied to the mold by the deformation mechanism, a setting load is applied to the mold by the deformation mechanism before the mold and the imprint material are brought into contact with each other, and the pattern region of the mold is deformed by the deformation mechanism, after the mold and the imprint material have been brought into contact with each other, so as to reduce an overlay error between the shot region and the pattern region.

7 Claims, 9 Drawing Sheets

MOLD Ma : DRIVING EFFICIENCY=m/a

IMPRINT APPARATUS, IMPRINT METHOD, AND METHOD OF MANUFACTURING ARTICLE

BACKGROUND OF THE INVENTION

Field of the Invention

The present invention relates to an imprint apparatus, an imprint method, and a method of manufacturing an article.

Description of the Related Art

An imprint apparatus brings an imprint material on a shot region of a substrate and a mold into contact with each other and cures the imprint material to form a pattern made of a cured product of the imprint material on the shot region of the substrate. To reduce an overlay error between the shot region and (a pattern region of) the mold, the imprint apparatus can include a deformation mechanism that can deform the pattern region of the mold by applying a force to a side surface of the mold.

Japanese Patent Laid-Open No. 2019-212674 discloses a technique that sets a preset driving amount of a deformation mechanism to be always greater (or always smaller) than a target driving amount to eliminate the influence of hysteresis caused by a difference in the driving direction of the deformation mechanism.

Japanese Patent Laid-Open No. 2013-102132 discloses a technique that uses both a mold shape correction mechanism for deforming a pattern region of a mold and a heating mechanism for deforming a pattern region of a substrate to reduce the difference between the shapes of the pattern region of the mold and the pattern region of the substrate.

How easily a deformation mechanism can be driven in a state in which a mold and an imprint material are in contact with each other can change depending on each individual mold. This is assumed to be due to individual differences between the surface states (the shape, the roughness, or the like) of molds.

The fact that the ease of the driving operation of a deformation mechanism changes depending on the individual mold means that the driving force necessary for correcting a predetermine amount of an overlay error between a mold and a shot region will change depending on the mold. Hence, the amount of overlay error that can be corrected by the deformation mechanism may change depending on the mold. For example, if the correction amount of a mold that is difficult to drive reaches the upper limit of a correction stroke of the deformation mechanism, a residual of the correction will be generated. In addition, a correction operation by a deformation mechanism is sometimes divided into a plurality of steps. Thus, if a large correction stroke is used in the initial step, the correction amount may become insufficient in the next step. This may increase the overlay error as a result. In an imprint apparatus, it is undesirable for the correction amount to change for each product depending on the individual mold.

SUMMARY OF THE INVENTION

The present invention provides a technique advantageous in reducing, for example, the influence of individual differences between molds on an operation of a mold deformation mechanism during an imprint process.

The present invention in its one aspect provides an imprint apparatus that performs an imprint process of forming a pattern on a shot region of a substrate by curing an imprint material in a state in which the imprint material on the shot region of the substrate and a mold are in contact with each other, comprising a mold holder configured to hold the mold; and a deformation mechanism configured to deform a pattern region of the mold by applying a force to a side surface of the mold held by the mold holder, wherein a setting load, based on a response property of the mold when the force is applied to the mold by the deformation mechanism, is applied to the mold by the deformation mechanism before the mold and the imprint material are brought into contact with each other, and the pattern region of the mold is deformed by the deformation mechanism, after the mold and the imprint material have been brought into contact with each other, so as to reduce an overlay error between the shot region and the pattern region.

Further features of the present invention will become apparent from the following description of exemplary embodiments (with reference to the attached drawings).

DESCRIPTION OF THE EMBODIMENTS

Figure 1:
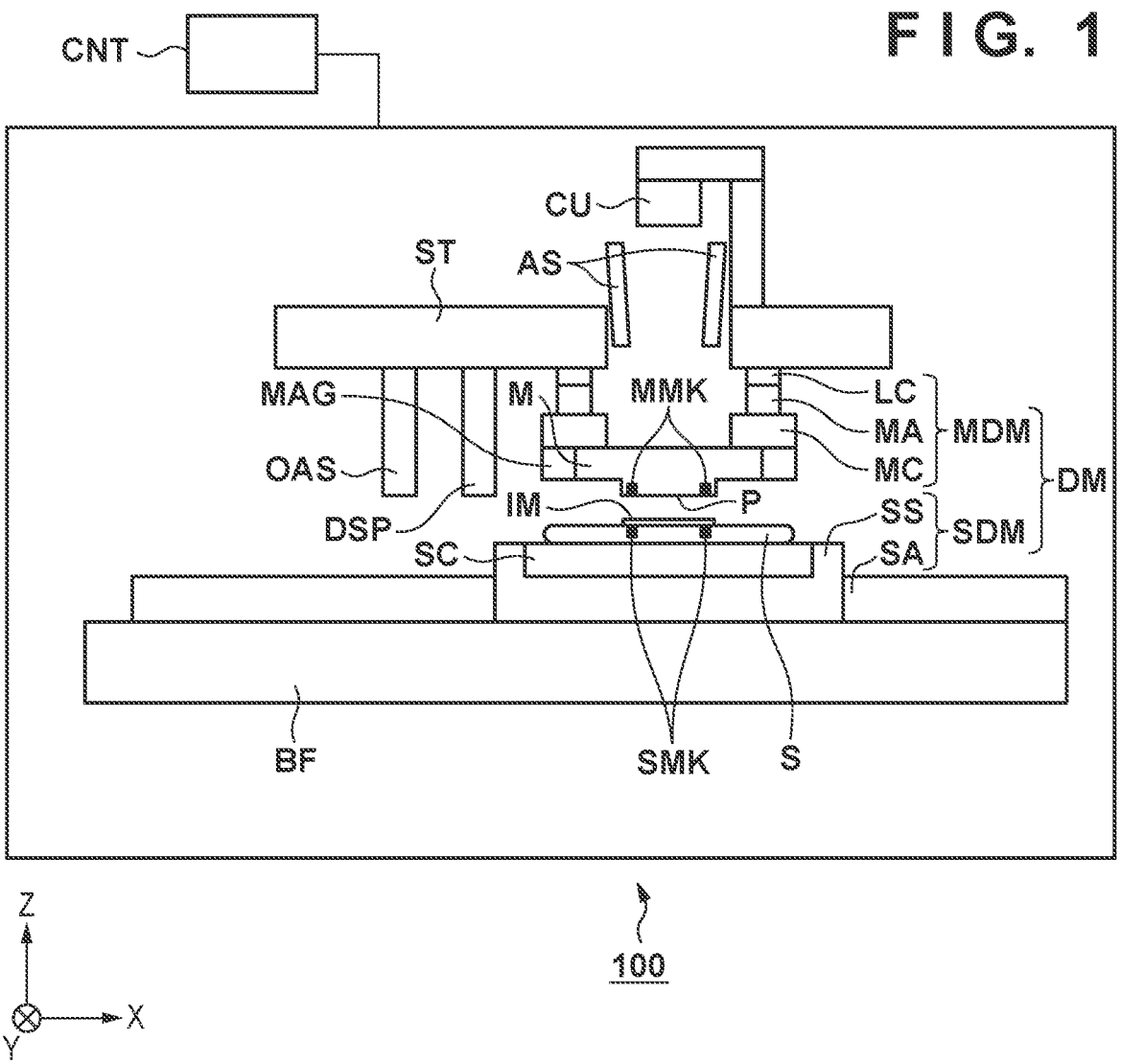
FIG. 1 is a view showing the arrangement of an imprint apparatus.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

FIG. 1 shows the arrangement of an imprint apparatus 100 according to an embodiment of the present invention. The imprint apparatus 100 is an apparatus that forms a pattern of a cured product to which a three-dimensional pattern of a mold has been transferred by bringing an imprint material supplied onto a substrate and the mold into contact with each other and curing the imprint material by applying curing energy to the imprint material. In this manner, the imprint apparatus 100 is formed to perform an imprint process to form a pattern made of a cured product of an imprint material IM on a substrate S. The imprint process can include a contact process, an alignment process, a curing process, and a separation process. A contact process is a process performed to bring the imprint material IM on a shot region (imprint target region) of the substrate S into contact with a pattern region P of a mold M. An alignment process is a process performed to align the shot region of the substrate S and the pattern region P of the mold M. An alignment process performed in an imprint process may include a deformation process which is performed to deform the pattern region P of the mold M to reduce an overlay error between the shot region of the substrate S and the pattern region P of the mold M. A curing process is a process performed to cure the imprint material IM. A separation process is a process performed to separate the pattern made of the cured product of the imprint material IM from the pattern region P of the mold M.

As an imprint material, a curable composition (to be also referred to a resin in an uncured state) to be cured by receiving the curing energy is used. Examples of the curing energy are an electromagnetic wave, heat, and the like. The electromagnetic wave is, for example, light selected from the wavelength range of 10 nm or more to 1 mm or less. Examples of the electromagnetic wave can be infrared light, a visible light beam, and ultraviolet light. The curable composition can be a composition that can be cured by light irradiation or heating. Among these compositions, a photo-curable composition cured by light irradiation contains at least a polymerizable composition and a photopolymerization initiator, and may further contain a nonpolymerizable compound or a solvent, as needed. A nonpolymerizable compound is at least one material selected from the group consisting of a sensitizer, a hydrogen donor, an internal mold release agent, a surfactant, an antioxidant, and a polymer component. The imprint material can be arranged on the substrate in the form of droplets or in the form of an island or a film obtained by connecting a plurality of droplets. The viscosity (the viscosity at 25° C.) of the imprint material is, for example, 1 mPa·s or more to 100 mPa·s or less. For example, glass, a ceramic, a metal, a semiconductor, a resin, or the like can be used as the material of the substrate. A member made of a material different from the substrate may be formed on the surface of the substrate as needed. The substrate is, for example, a silicon wafer, a compound semiconductor wafer, or silica glass.

In the specification and the accompanying drawings, directions will be indicated by an XYZ coordinate system in which directions parallel to the surface of the substrate S are set as the X-Y plane. Assume that directions parallel to the X-axis, the Y-axis, and the Z-axis of the XYZ coordinate system are the X direction, the Y direction, and the Z direction, respectively. Assume that a rotation about the X-axis, a rotation about the Y-axis, and a rotation about the Z-axis are θX, θY, and θZ, respectively. Control operations or driving operations related to the X-axis, the Y-axis, and the Z-axis represent control operations or driving operations related to a direction parallel to the X-axis, a direction parallel to the Y-axis, and a direction parallel to the Z-axis, respectively. In addition, control operations or driving operations related to the ex-axis, the θY-axis, and the θZ-axis indicate control operations or driving operations related to a rotation about an axis parallel to the X-axis, a rotation about an axis parallel to the Y-axis, and a rotation about an axis parallel to the Z-axis, respectively. In addition, a position is information that can be specified based on coordinates on the X-, Y-, and Z-axes, and an orientation is information that can be specified by values on the θX-, θY-, and θZ-axes. Positioning indicates control of the position and/or orientation. Alignment (alignment process) can include control of the position and/or orientation of at least one of the substrate and the mold.

The imprint apparatus 100 can include a substrate driving mechanism SDM for holding and driving the substrate S, a base frame BF for supporting the substrate driving mechanism SDM, a mold driving mechanism MDM for holding and driving the mold M, and a structure ST for holding the mold driving mechanism MDM. The substrate driving mechanism SDM can include a substrate stage SS including a substrate chuck SC for holding the substrate S and a substrate positioning mechanism SA for positioning the substrate S by positioning the substrate stage SS. The mold driving mechanism MDM can include a mold chuck MC (mold holder) for holding the mold M and a mold positioning mechanism MA for positioning the mold M by positioning the mold chuck MC. The mold driving mechanism MDM includes a detector LC for detecting a force applied to the mold M in a contact process and/or a separation process. The mold driving mechanism MDM can further include a pressure mechanism for applying a pressure on a surface on a side opposite to the pattern region P of the mold M so as to deform the pattern region P into a convex shape toward the substrate S.

The substrate driving mechanism SDM and the mold driving mechanism MDM constitute a driving mechanism DM for driving at least one of the substrate S and the mold M so as to change a relative position between the substrate S and the mold M. Changing the relative position by using the driving mechanism DM includes driving performed to bring the pattern region P of the mold M into contact with the imprint material IM on the substrate S and driving performed to separate the mold M from the cured imprint material (cured product pattern). In other words, changing the relative position by using the driving mechanism DM includes changing the relative position between the substrate S and the mold M to perform a contact process and a separation process. The substrate driving mechanism SDM can be configured to drive the substrate S with respect to a plurality of axes (for example, three axes including the X-axis, Y-axis, and θZ-axis, and preferably six axes including the X-axis, Y-axis, Z-axis, ex-axis, θY-axis, and θZ-axis). The mold driving mechanism MDM can be configured to drive the mold M with respect to a plurality of axes (for example, three axes including the Z-axis, θX-axis, and θY-axis, and preferably six axes including the X-axis, Y-axis, Z-axis, θXx-axis, θY-axis, and θZ-axis).

The imprint apparatus 100 can further include a deformation mechanism MAG that deforms the pattern region P of the mold M. The deformation mechanism MAG can deform the pattern region P so as to change the shape (including the size) of the pattern region P within a plane parallel to an X-Y plane. The deformation mechanism MAG can deform the pattern region P by applying a force to each of the four side surfaces of the mold M.

The imprint apparatus 100 can include a dispenser DSP. The dispenser DSP may be configured as an external apparatus of the imprint apparatus 100. The dispenser DSP (supplying device) arranges (supplies) the imprint material IM on a shot region of the substrate S. The imprint material IM can be arranged on a shot region of the substrate S, while the substrate S is being driven by the substrate driving mechanism SDM, by causing the dispenser DSP to discharge the imprint material IM in synchronism with the driving. In this case, a contact process, an alignment process, a curing process, and a separation process can be executed every time the dispenser DSP arranges the imprint material IM on one shot region of the substrate S. Alternatively, after the dispenser DSP has arranged the imprint material IM on a plurality of shot regions on the substrate S, a contact process, an alignment process, a curing process, and a separation process may be executed for each of the plurality of shot regions.

The imprint apparatus 100 can further include a curing device CU. The curing device CU cures the imprint material IM by irradiating the imprint material IM with curing energy while the pattern region P of the mold M is in contact with the imprint material IM on the substrate S. This forms a pattern formed from a cured product of the imprint material IM on the substrate S.

The imprint apparatus 100 can further include a measurement device AS that measures the positions of marks SMK of a shot region of the substrate S, the positions of marks MMK of the mold M, a relative position between the marks SMK and the marks MMK, and the like. The imprint apparatus 100 can further include an off-axis scope OAS that detects (measures) the positions of marks SMK of the shot region of the substrate S.

The imprint apparatus 100 can further include a controller CNT. The controller CNT can control the driving mechanism DM, the deformation mechanism MAG, the dispenser DSP, the curing device CU, the measurement device AS, and the off-axis scope OAS. The controller CNT can be formed from, for example, a PLD (the abbreviation of a Programmable Logic Device) such as an FPGA (the abbreviation of a Field Programmable Gate Array), an ASIC (the abbreviation of an Application Specific Integrated Circuit), a general-purpose or dedicated computer embedded with a program, or a combination of all or some of these components. The controller CNT may be provided in the imprint apparatus 100 or installed in a separate location from the imprint apparatus 100 and be remotely controlled.

The controller CNT can compute the shape of a shot region of the substrate S based on a result of detection by the measurement device AS, for example, the positions of the marks SMK of the shot region of the substrate S. The controller CNT can also compute the shape of the pattern region P of the mold M based on a result of detection by the measurement device AS, for example, the positions of the mark MMK of the mold M. The controller CNT can compute an overlay error between the shot region of the substrate S and the pattern region P of the mold M based on the shape of the shot region and the shape of the pattern region P obtained in this manner. Alternatively, the controller CNT can compute the overlay error between the shot region of the substrate S and the pattern region P of the mold M based on, for example, a relative position between the marks SMK of the substrate S and the marks MMK of the mold M. In other words, the controller CNT can compute an overlay error between the shot region of the substrate S and the pattern region P (difference between the shape of the shot region and the shape of the pattern region) of the mold M based on the output from the measurement device AS. An overlay error can include, for example, a magnification component and a distortion component (for example, a component such as a rhombic component, a trapezoid component, or the like or a higher-order component).

Figure 2:
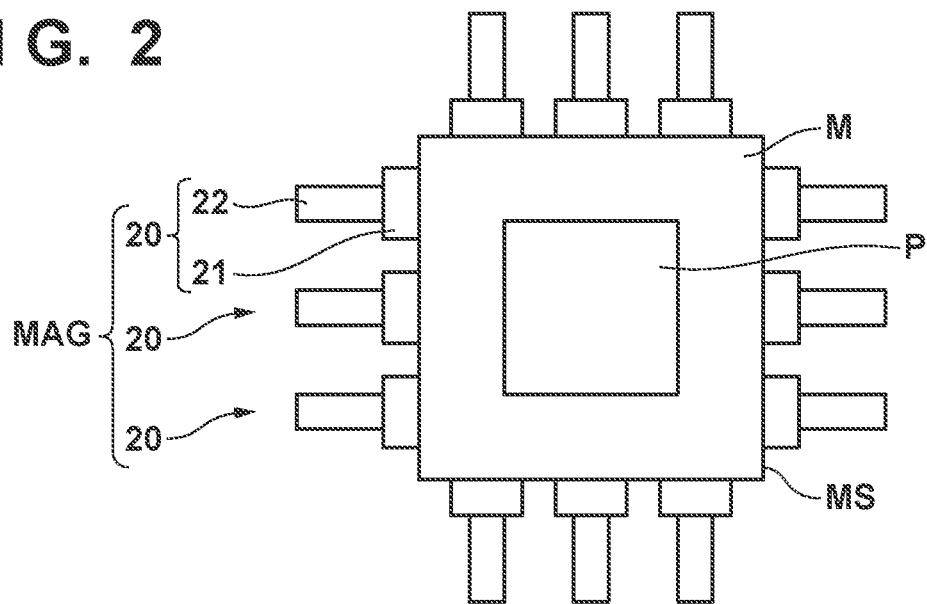
FIG. 2 is a view showing an example of the arrangement of a deformation mechanism.

FIG. 2 shows an example of the arrangement of the deformation mechanism MAG. The deformation mechanism MAG can deform the pattern region P of the mold M by applying a force to each of four side surfaces MS of the mold M. Components of the shape (including the size) of the pattern region P which can be controlled by the deformation mechanism MAG can include, for example, a magnification component and a distortion component (for example, a component such as a rhombic component, a trapezoid component, or the like or a higher-order component). The deformation mechanism MAG can include a plurality of units 20. Each unit 20 can include a contact portion 21, which contacts the corresponding side surface MS, and an actuator 22 for driving the contact portion 21. Although the actuator 22 can include, for example, a piezoelectric element, but may also include another element.

Figure 3A:
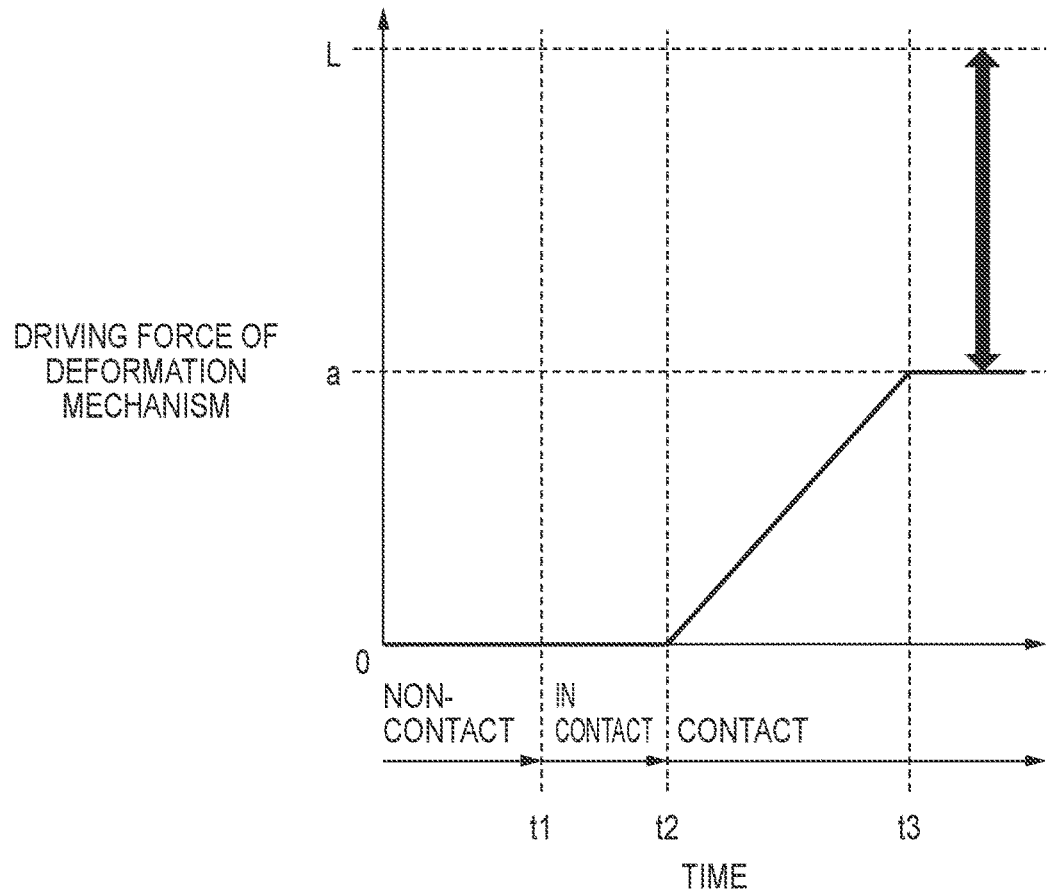
FIGS. 3A and 3B are views for explaining response properties of molds.
Figure 3A:
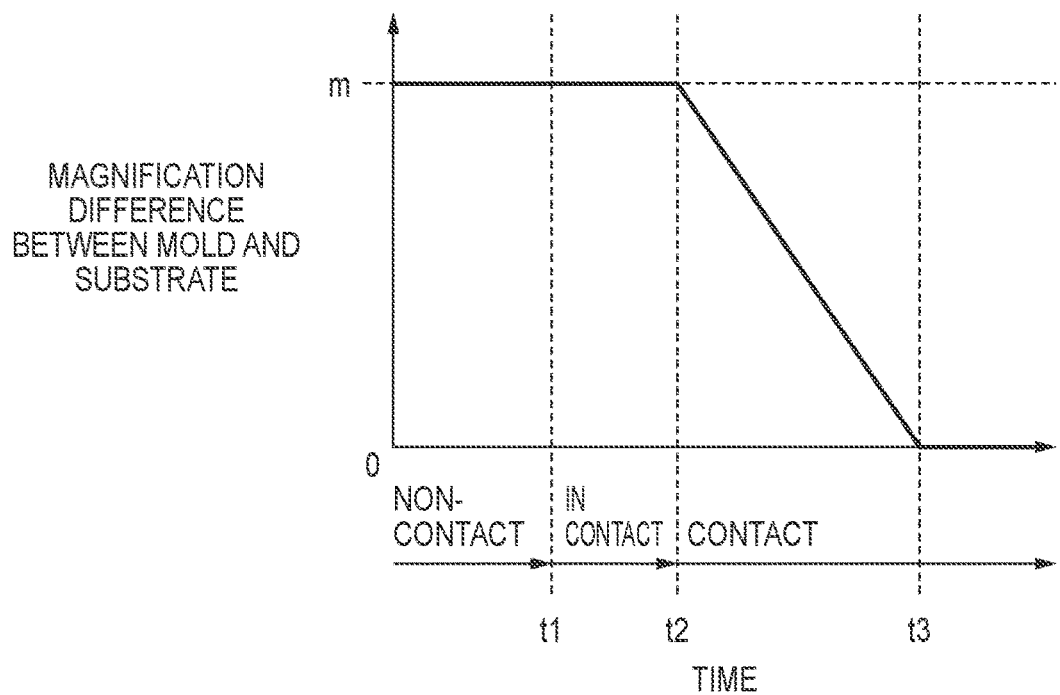
Figure 3B:
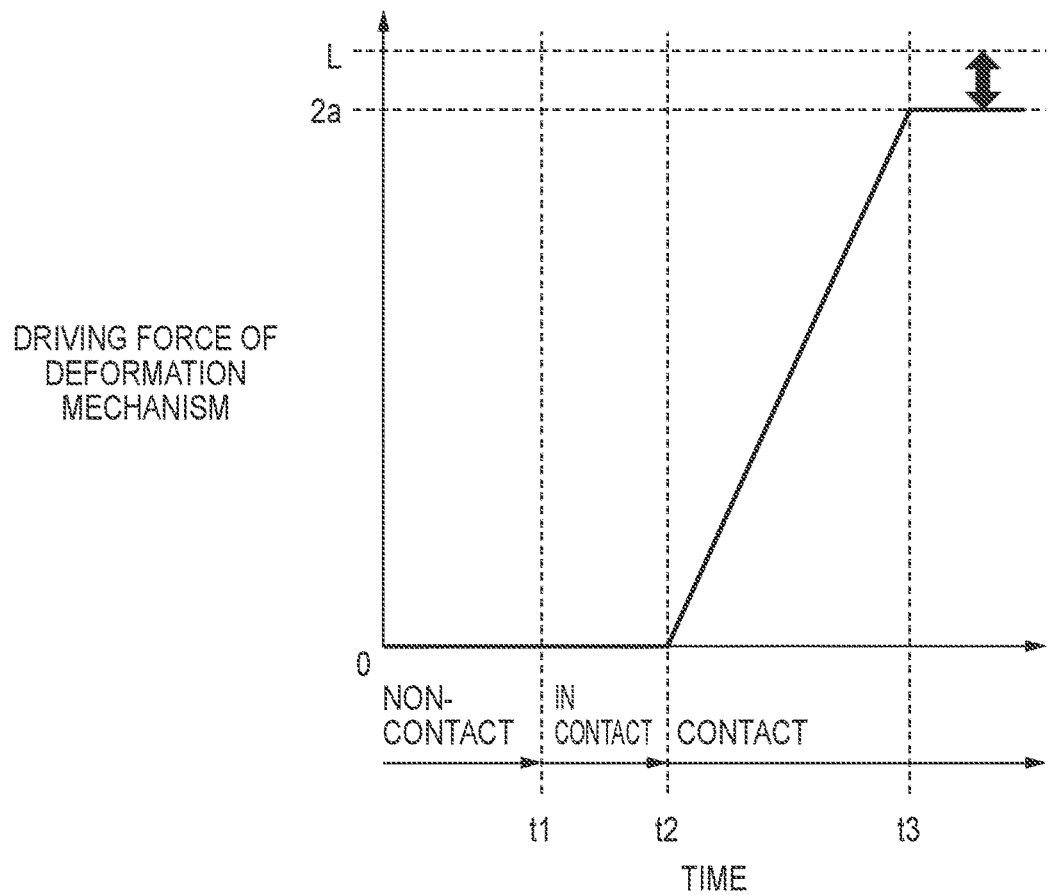
Figure 3B:
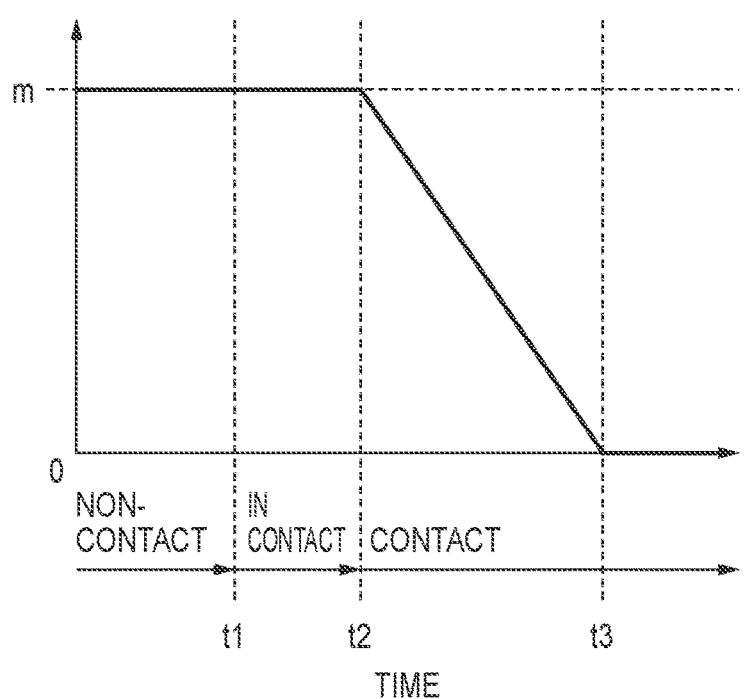

FIGS. 3A and 3B are views for explaining the response properties of two molds Ma and Mb. A response property refers to a property that shows the relationship between a driving force of the deformation mechanism MAG and a modification amount of a mold in a state in which the mold and the imprint material have been brought into contact with each other. The ease of the driving operation (driving efficiency) of the deformation mechanism MAG in a state in which the mold and the imprint material on the substrate are in contact with each other changes depending on the individual differences of molds. The response property can be expressed as, for example, modification amount of mold M/driving force of deformation mechanism MAG The response property can differ for each individual mold. This is assumed to be due to individual differences between the surface states (the shape, the roughness, or the like) of the respective molds. In the following description, the magnification of the mold will be used as an example for the sake of descriptive convenience.

FIG. 3A shows a state in which the magnification of the mold Ma is changed by using the deformation mechanism MAG to apply a force to the mold Ma. From time 0 to time t1, a non-contact state in which the mold Ma and the imprint material IM of the substrate S are spatially separated is set. A process for bringing the mold Ma and the imprint material IM into contact with each other starts at time t1, and the entire pattern portion of the mold Ma will be in contact with the imprint material IM at time t2. From time t2 to time t3, the deformation mechanism MAG is driven in the contact state to change a magnification difference between (the shot region of) the substrate S and the mold M from m to 0. Assume here that the magnification of the substrate is invariable, and the magnification difference between the substrate and the mold changes by only the deformation amount of the mold Ma. Assume that a is a driving force of the mold positioning mechanism MA which is necessary at this time. The driving force is detected by the detector LC. A driving efficiency can be expressed as m/a.

FIG. 3B shows a state in which the magnification of the mold Mb is changed by using the deformation mechanism MAG to apply a force to the mold Mb. A driving force 2a which is greater than the driving force a is needed to cause the same amount of magnification change as that of the mold Ma. The driving efficiency is expressed as m/2a. Hence, in this example, the driving efficiency of the deformation mechanism MAG with respect to the mold Mb is low compared to the mold Ma. Here, assume that L is an upper limit (driving limit) of the driving force that can be output by the deformation mechanism MAG. Observing the driving force at the time of the completion of the alignment, it can be seen that the mold Ma has a greater allowance to the driving limit L than the mold Mb.

The fact that the behavior of the apparatus at the time of contact will change depending on each individual mold may destabilize the apparatus performance. Hence, in this embodiment, a load (setting load) that is to be applied to the mold by the deformation mechanism MAG will be adjusted before the process for bringing the mold and the imprint material into contact is started. As the mold and the imprint material on the substrate are repeatedly brought into contact with each other many times, the mold can accumulate damage, and a pattern breakdown and the like can occur. Manufacturing a mold each time by using an electron-beam drawing apparatus or the like to directly draw a pattern on a blank mold will result in an enormous cost and greatly increase the production cost. Hence, as a solution, an imprint technique may be used to manufacture a plurality of replica molds which are copies of a master mold, and the imprint apparatus may be operated by appropriately replacing the replica molds. Therefore, checking the response properties of the individual (replica) molds will be useful in improving the stability of the apparatus performance.

Figure 4:
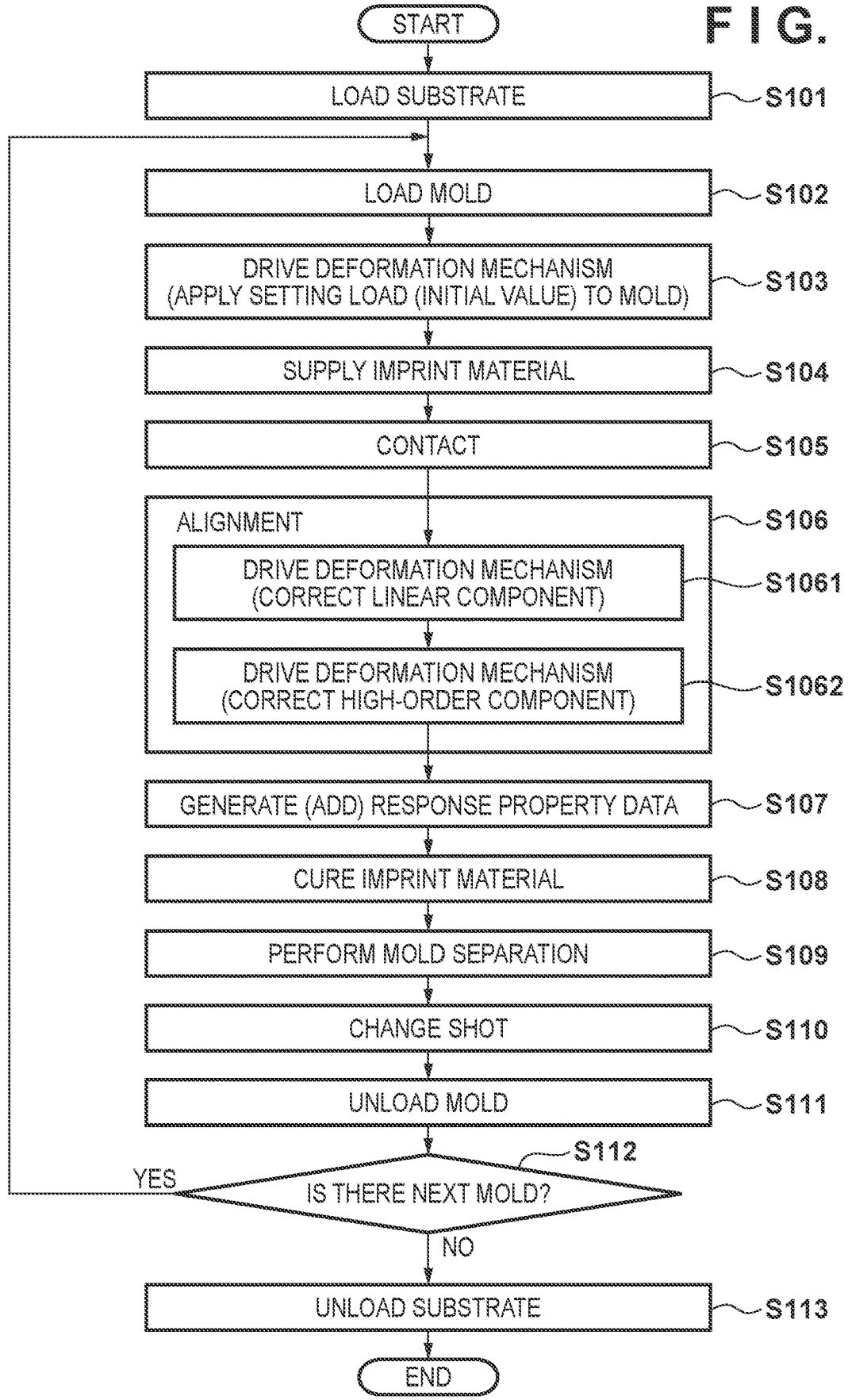
FIG. 4 is a flowchart of processing for generating response property data.

FIG. 4 is a flowchart of processing for generating response property data that represent the response properties of a plurality of molds. This processing is performed in a preparation stage before the execution of the imprint process.

In step S101, the controller CNT controls a substrate conveyance mechanism (not shown) to load a substrate (for example, a pilot substrate). The loaded substrate is held by the substrate chuck SC.

In step S102, the controller CNT controls a mold conveyance mechanism (not shown) to load a mold. The loaded mold is held by the mold chuck MC.

In step S103, the controller CNT controls the deformation mechanism MAG and applies a setting load to each side surface of the mold M. Assume that this setting load is set to a predetermined initial value (default value).

In step S104, the controller CNT controls the dispenser DSP to supply an imprint material to a shot region of the substrate.

In step S105, the controller CNT controls the driving mechanism DM to bring the mold and the imprint material supplied on the shot region into contact with each other.

In step S106, the controller CNT executes an alignment process in a state in which the mold and the imprint material are in contact with each other. In the alignment process, the controller CNT uses the measurement device AS to simultaneously observe the marks SMK of the shot region and the marks MMK of the mold and detect a relative positional shift (overlay error) between the substrate and the mold. The controller CNT controls, for example, the substrate driving mechanism SDM so as to reduce the detected relative positional shift. The alignment process also includes using the deformation mechanism MAG to deform (correct) the pattern region of the mold so as to reduce the relative positional shift. For example, in step S1061, overlay error components such as a translation component, a rotation component, and the like can be corrected in addition to the magnification by controlling the deformation mechanism MAG. Furthermore, in step S1062, a high-order component of the overlay error can be corrected.

In step S107, the controller CNT generates response property data in which an identifier of each mold and a corresponding response property have been associated and written. The generated response property data is stored in, for example, a memory in the controller CNT. A difference between the relative positional shift at the start of alignment and the relative positional shift at the completion of alignment will be referred to as "the deformation amount of the mold". In addition, a difference between the driving force of the deformation mechanism MAG at the start of alignment and the driving force of the deformation mechanism MAG at the completion of alignment will be referred to as "the driving force of the deformation mechanism MAG". A response property is calculated as "the deformation amount of the mold" with respect to "the driving force of the deformation mechanism MAG".

In step S108, the controller CNT controls the curing device CU to cure the imprint material on the substrate.

In step S109, the controller CNT controls the driving mechanism DM to perform a mold separation process to separate the mold from the cured imprint material.

In step S110, the controller CNT changes the shot region set as the imprint target region.

In step S111, the controller CNT controls the mold conveyance mechanism to unload the mold. In step S112, the controller CNT determines whether there is a mold to be processed (inspected) next. If it is determined that there is a mold to be processed next, the process returns to step S102 to repeat the processing. By repeating the processing, the response property of each mold will be added to the response property data in step S107. If it is determined in step S112 that there is no mold to be processed next, the controller CNT will control, in step S113, the substrate conveyance mechanism to unload to substrate and end the processing.

Figure 5:
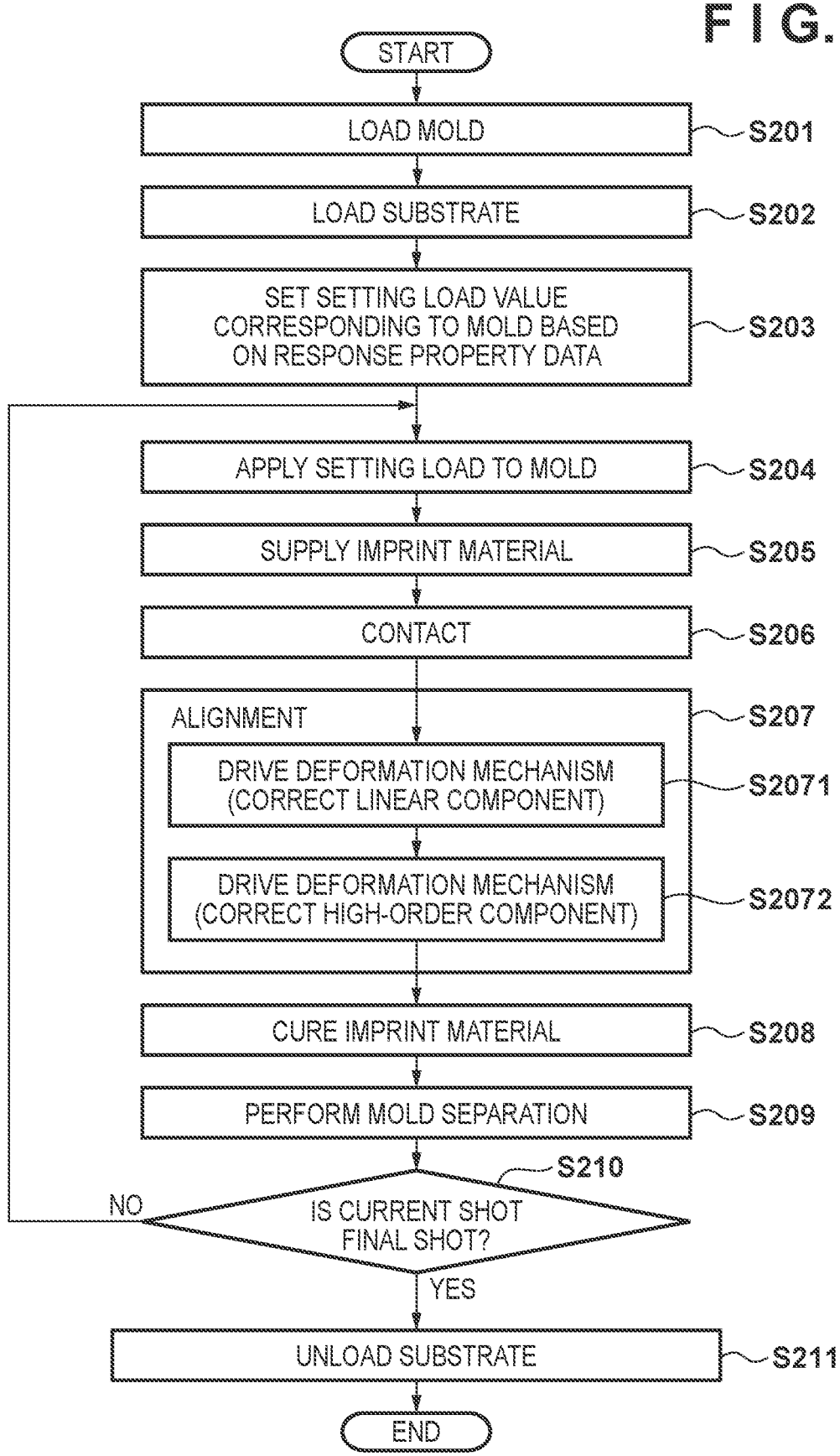
FIG. 5 is a flowchart of a series of imprint processes performed on a substrate.

FIG. 5 is a flowchart showing a series of imprint processes to be performed on a substrate.

In step S201, the controller CNT controls the mold conveyance mechanism (not shown) to load a mold. The loaded mold is held by the mold chuck MC. At this time, the identifier of the loaded mold is stored in the memory.

In step S202, the controller CNT controls the substrate conveyance mechanism to load the substrate. The loaded substrate is held by the substrate chuck SC.

In step S203, the controller CNT determines the response property corresponding to the identifier of the loaded mold by referring to the response property data stored in the memory, and obtains a setting load based on the response property.

In step S204, the controller CNT controls the deformation mechanism MAG to apply the setting load, obtained in step S203, to each side surface of the mold M.

In step S205, the controller CNT controls the dispenser DSP to supply the imprint material to the shot region of the substrate.

In step S206, in a state in which the setting load is applied to the mold, the controller CNT controls the driving mechanism DM to bring the mold and the imprint material supplied to the shot region into contact with each other.

In step S207, the controller CNT executes an alignment process in a state in which the mold and the imprint material are in contact with each other. In the alignment process, the controller CNT uses the measurement device AS to detect a relative positional shift (overlay error) between the substrate and the mold by simultaneously observing the marks SMK of the shot region and the marks MMK of the mold. The controller CNT controls, for example, the substrate driving mechanism SDM so as to reduce detected relative positional shift. Also, in the alignment process, the deformation mechanism MAG is controlled so as to reduce the relative positional shift. For example, in step S2071, overlay error components such as a translation component, a rotation component, and the like can be corrected in addition to the magnification by controlling the deformation mechanism MAG. Furthermore, in step S2072, a high-order component of the overlay error can be corrected.

In step S208, the controller CNT controls the curing device CU to cure the imprint material on the substrate.

In step S209, the controller CNT controls the driving mechanism DM to perform a mold separation process of separating the mold from the cured imprint material.

In step S210, the controller CNT determines whether the current shot is the final shot. If the current shot is not the final shot, the process returns to step S204, and the processes are repeated for the next shot. If the current shot is determined to be the final shot, the controller CNT will control, in step S211, the substrate conveyance mechanism to unload the substrate and end the imprint process.

Figure 6A:
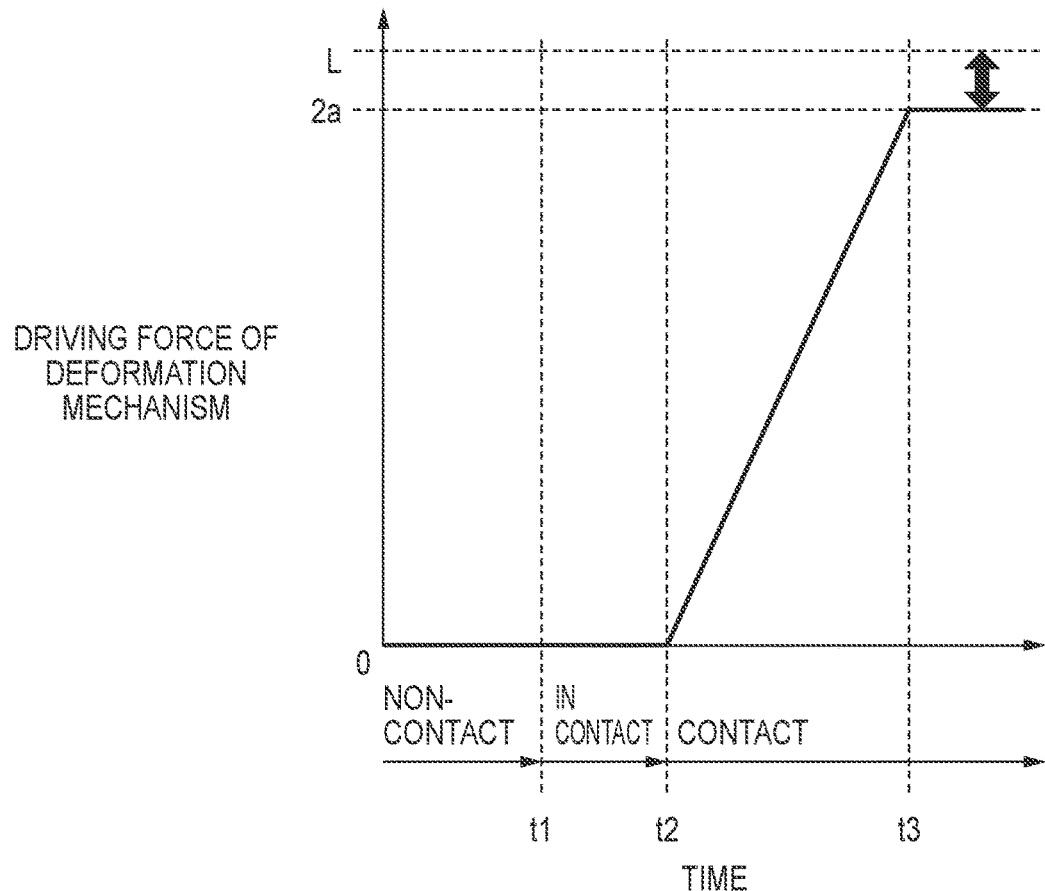
FIGS. 6A and 6B are views for explaining an effect of applying a setting load on the mold.
Figure 6A:
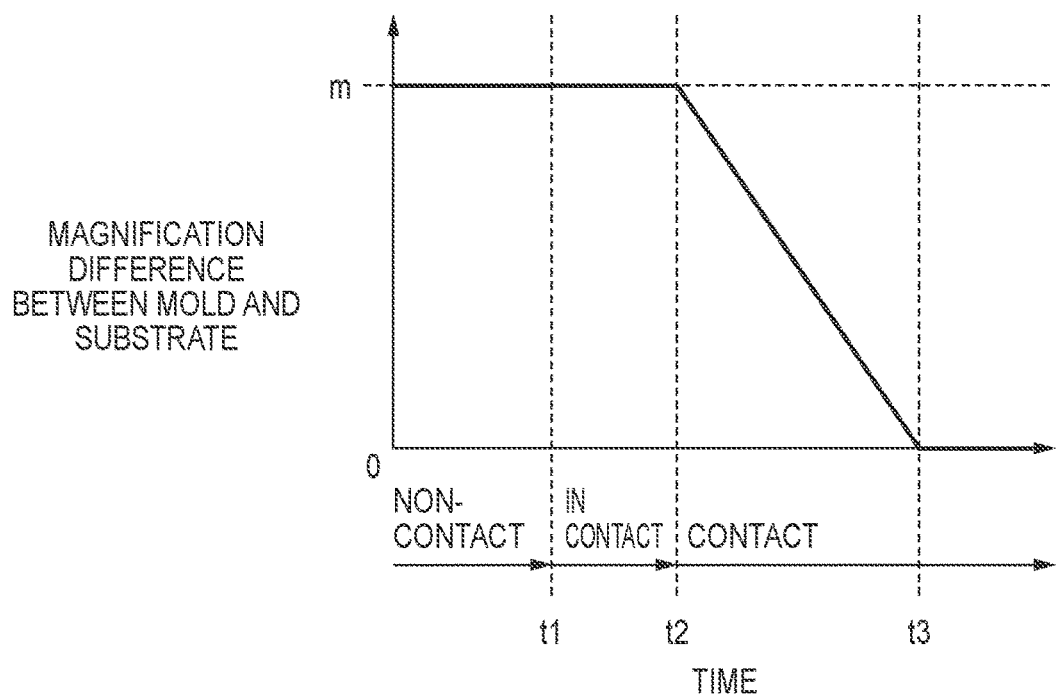
Figure 6B:
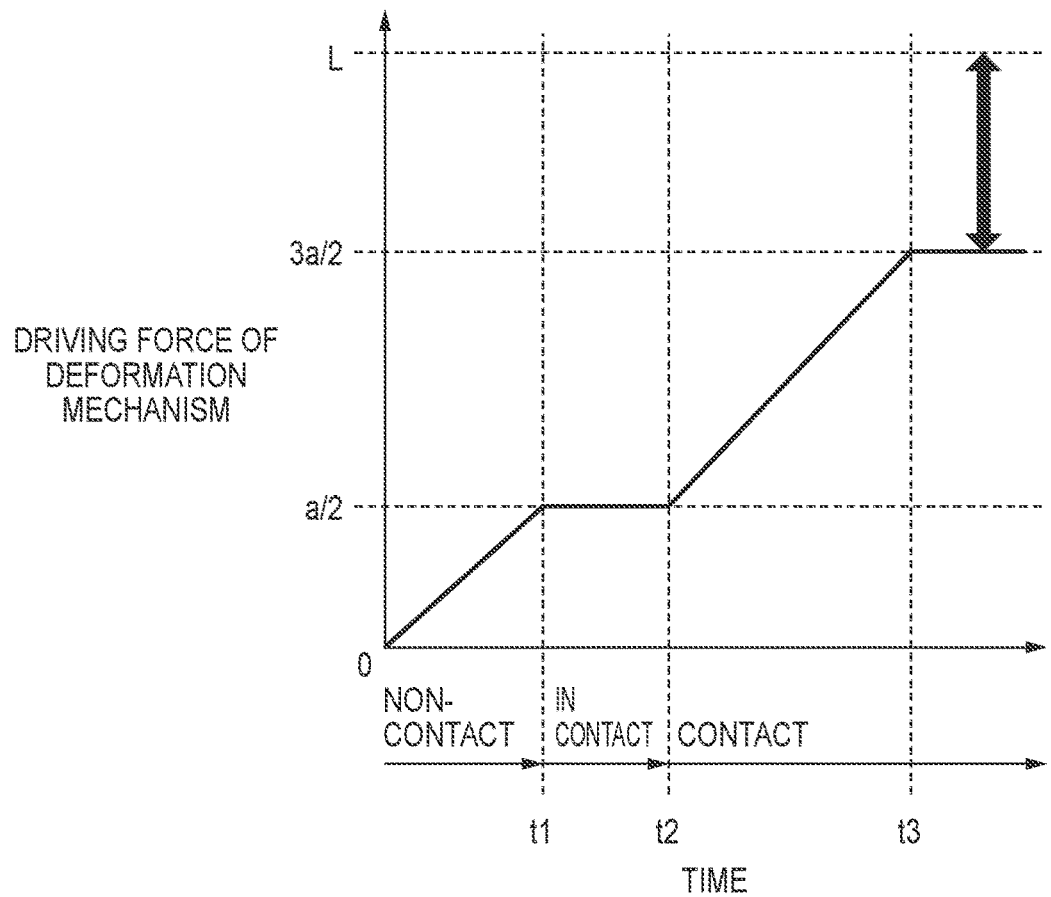
Figure 6B:
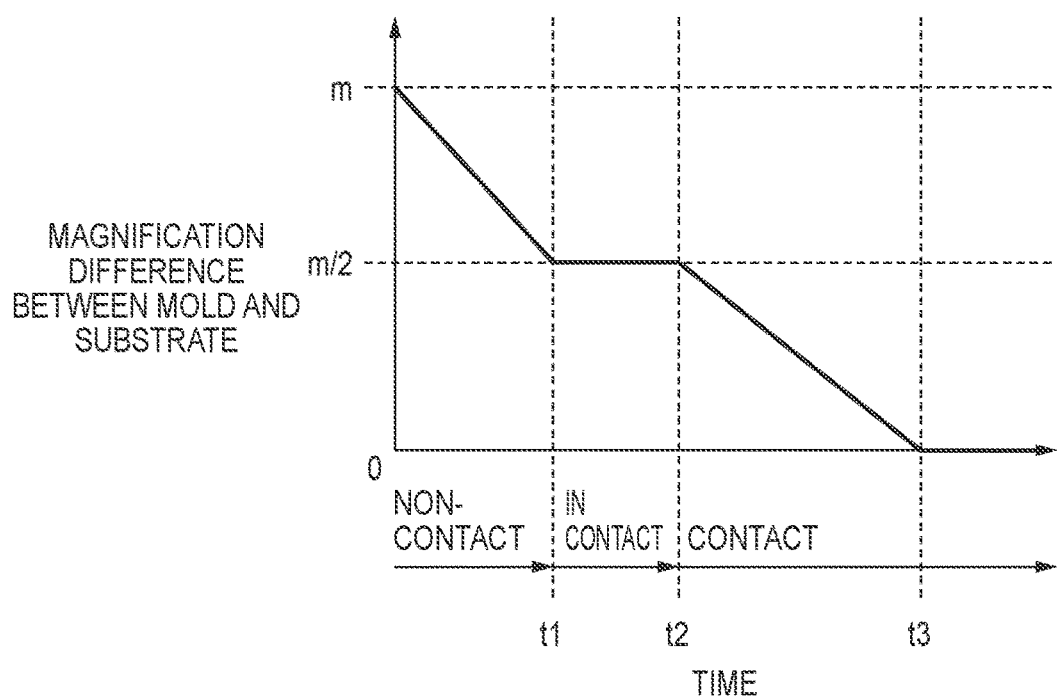

The effect of the imprint process according to this embodiment will be described with reference to FIGS. 6A and 6B. FIG. 6A is a view showing the behavior of a related art in a case in which the mold Mb which has a lower driving efficiency than the mold Ma is used, and is the same as that shown in FIG. 3B. FIG. 6B shows a case in which a setting load obtained in step S203 has been applied to the mold Mb by the deformation mechanism MAG. Although the magnification of the mold will be exemplified here, the target is not limited to the magnification. In step S203, the setting load can be calculated based on a ratio of the response property of a mold that is currently used to the response property of a mold which serves as a reference. For example, if the driving efficiency m/a with respect to the mold Ma is set as the reference, the ratio to the driving efficiency m/2a with respect to the mold Mb will be ½. In this case, the setting load value of the deformation mechanism MAG will be a×(1−½)=a/2. This determination (step S203) of the setting load value is executed before time 0. Subsequently, the deformation mechanism MAG is driven, from the point of time 0 until before time t1, to a/2 in a non-contact state to set the magnification difference between the mold and the substrate to the state of m/2. Note that since the phenomenon in which the driving efficiency degrades due to the mold that occurs in a contact state does not does not appear in a non-contact state, assume that the magnification of the mold will change in a normal manner by only the amount by which the deformation mechanism MAG is driven. In addition, the closer the setting load value is to a, the driving force at time t3 will be in a state with some allowance with respect to the driving limit L. However, it is preferable for the driving direction of the deformation mechanism MAG to always be constant. If the deformation mechanism MAG is driven near the driving force a, the driving direction in a subsequent alignment process may be set in reverse in some cases due to variation in the magnification of the substrate. Hence, the setting load needs to be set to a value which is not close to the driving force value a, but a value apart from the driving force value a with some allowance. The degree to which the value is to be apart from the driving force value a can be determined in accordance with the variation of each substrate to be processed or each shot region of the substrate.

In step S205, the dispenser DSP arranges (supplies), before time t1, the imprint material IM to the shot region of the substrate S. Subsequently, between time t1 to time t2, an alignment operation by the substrate driving mechanism SDM and the mold driving mechanism MDM is performed to bring the pattern region P of the mold M into contact with the imprint material IM on the shot region of the substrate S (step S206). As a result, a contact state (a state in which the mold and the substrate are in contact with each other via the imprint material) is set.

In step S2071, an alignment operation (first driving operation) targeting a linear component including the magnification is performed. This alignment operation is performed between time t2 and time t3. In FIG. 6B, since the setting load set in step S203 has been applied to the mold by driving the deformation mechanism MAG in step S204 before contact, the necessary magnification change amount of the mold Mb is m/2, which is half of that of FIG. 3B. This driving force, of the deformation mechanism MAG during the contact state, which is necessary for generating this magnification change will be (m/2)/(m/2a)=a when calculated based on the driving efficiency m/2a with respect to the mold Mb. That is, the driving force of the deformation mechanism MAG at the completion of the alignment operation at time t3 will be a/2+a=3a/2. Hence, the allowance to the driving limit L will increase compared to that of FIG. 3B.

In step S2071, overlay error components such as a translation component, a rotation component, and the like are corrected in addition to the magnification. Note that in step S207, the mold and the substrate need to be in a contact state since the process will be performed as the measurement device AS detects the relative positional shift between the marks SMK of the shot region and the marks MMK of the mold M.

In step S2072, correction (second driving operation) targeting a high-order component of the overlay error is performed. The correction of the high-order component is performed by the remaining strokes of the deformation mechanism MAG which had undergone the process of step S2071. Since the setting load value has been changed to a value corresponding to the response property of the mold in steps S203 and S204, the correction of the high-order component can be performed in a state with some allowance to the driving limit L even when the mold Mb which is characterized by a low driving efficiency is used. The correction of the high-order component suffices to be performed at time t3 or later and before the subsequent curing/separation process.

The difference in the overlay error correction amount between a mold with a low driving efficiency and a mold with a high driving efficiency can be reduced in this manner. As a result, the stability of the apparatus can be improved.

Second Embodiment

In the above-described first embodiment, a response property of a mold held by a mold chuck MC is obtained from response property data that has been obtained in advance. In contrast, in the second embodiment, the processing for generating the response property data in advance will not be performed. Instead, the response property of the mold will be obtained during the first shot (an imprint process performed on the first shot region of a substrate) during an imprint process.

Figure 7:
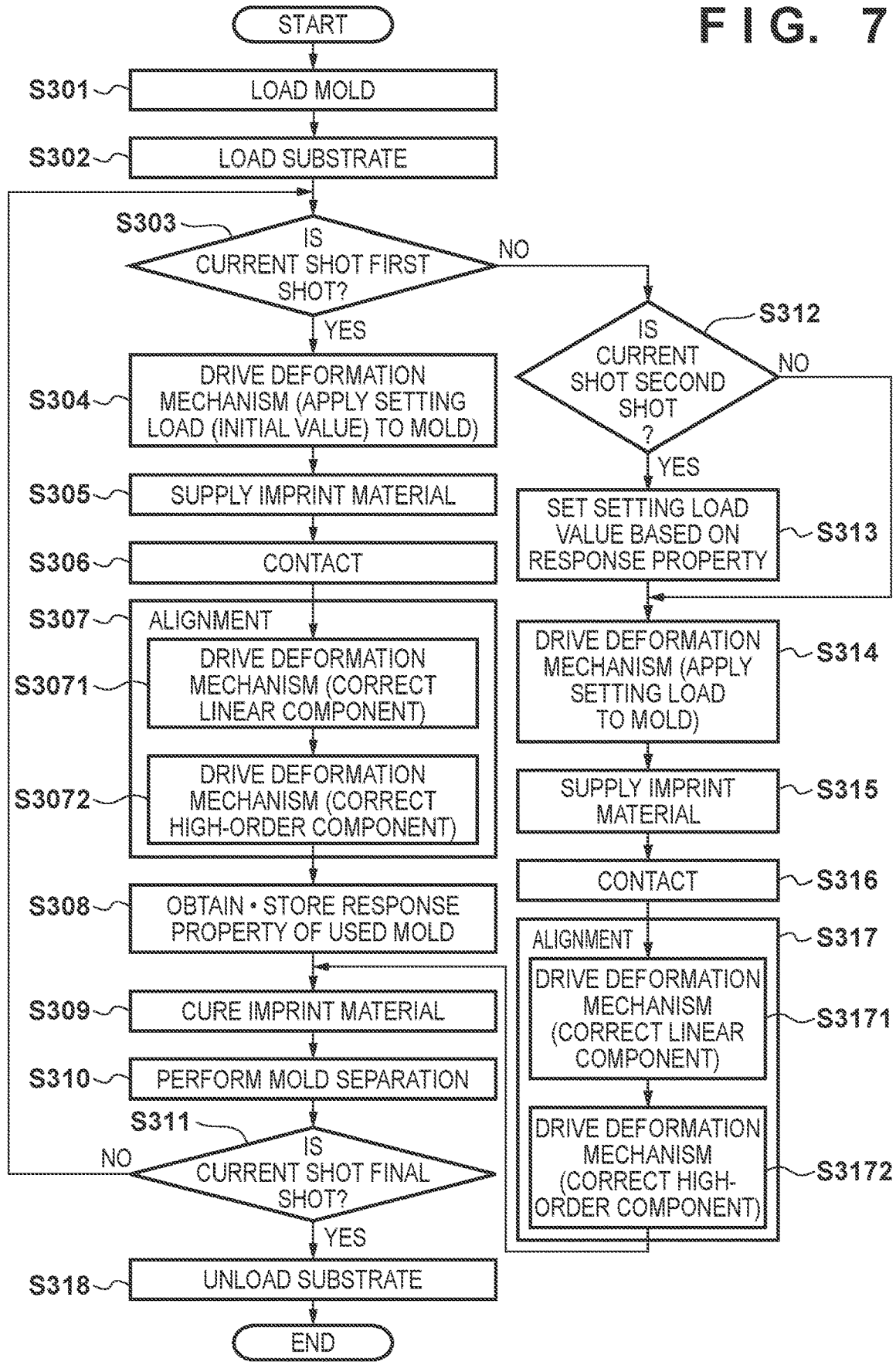
FIG. 7 is a flowchart of a series of imprint processes performed on a substrate.

FIG. 7 is a flowchart of a series of imprint processes performed on a substrate according to this embodiment.

In step S301, a controller CNT controls the mold conveyance mechanism (not shown) to load the mold. The loaded mold is held by the mold chuck MC.

In step S302, the controller CNT controls a substrate conveyance mechanism (not shown) to load a substrate. The loaded substrate is held by a substrate chuck SC.

In step S303, the controller CNT determines whether the current shot is the first shot. If it is determined that the current shot is the first shot, the process advances to step S304. Otherwise, the process advances to step S312.

In step S304, the controller CNT controls a deformation mechanism MAG to apply a setting load to each side surface of a mold M. Assume that this setting load is set to predetermined initial value (default value).

In step S305, the controller CNT controls a dispenser DSP to supply an imprint material to the first shot region of the substrate.

In step S306, the controller CNT controls a driving mechanism DM to bring the mold and the imprint material supplied onto the first shot region into contact with each other.

In step S307, the controller CNT completes bringing the mold and the imprint material into contact with each other, and executes an alignment process in the state in which the mold and the imprint material are in contact with each other. In the alignment process, the controller CNT uses a measurement device AS to detect a relative positional shift (overlay error) between the substrate and the mold by simultaneously observing marks SMK of the shot region and marks MMK of the mold. The controller CNT controls, for example, a substrate driving mechanism SDM so as to reduce the detected relative positional shift. Also, in the alignment process, the controller CNT controls the deformation mechanism MAG so as to reduce the relative positional shift. For example, in step S3071, overlay error components such as a translation component, a rotation component, and the like can be corrected in addition to the magnification by controlling the deformation mechanism MAG. Furthermore, in step S3072, a high-order component of the overlay error can be corrected.

In step S308, the controller CNT obtains the response property of the mold that is currently used. The obtained response property data is stored in the memory. Here, a difference between the relative positional shift at the start of alignment and the relative positional shift at the completion of alignment will be referred to as "the deformation amount of the mold". In addition, a difference between the driving force of the deformation mechanism MAG at the start of alignment and the driving force of the deformation mechanism MAG at the completion of alignment will be referred to as "the driving force of the deformation mechanism MAG". A response property is calculated as "the deformation amount of the mold" with respect to "the driving force of the deformation mechanism MAG".

In step S309, the controller CNT controls a curing device CU to cure the imprint material on the substrate.

In step S310, the controller CNT controls the driving mechanism DM to perform a mold separation process to separate the mold from the cured imprint material.

In step S311, the controller CNT determines whether the current shot is the final shot. If the current shot is not the final shot, the process returns to step S303, and the processes are repeated for the next shot.

If it is determined in step S304 that the current shot is not the first shot, the process advances to step S312. In step S312, if the current show is determined to be the second shot which is the shot following the first shot, the controller CNT will read out, in step S313, the response property stored in the memory in step S308 and set (update) the setting load value based on this response property.

In step S314, the controller CNT will control the deformation mechanism MAG to apply the setting load that has been updated in step S313 to each side surface of the mold M.

In step S315, the controller CNT controls the dispenser DSP to supply the imprint material to the second shot region of the substrate.

In step S316, the controller CNT controls the driving mechanism DM to bring the mold and the imprint material supplied to the second shot region into contact with each other in a state in which the setting load is applied to the mold.

In step S317, the controller CNT executes an alignment process in the state in which the mold and the imprint material are in contact with each other. In the alignment process, the controller CNT uses the measurement device AS to detect a relative positional shift (overlay error) between the substrate and the mold by simultaneously observing the marks SMK of the shot region and the marks MMK of the mold. The controller CNT controls, for example, the substrate driving mechanism SDM so as to reduce the detected relative positional shift. The alignment process also includes using the deformation mechanism MAG to deform (correct) the pattern region of the mold so as to reduce the relative positional shift. For example, in step S3171, overlay error components such as a translation component, a rotation component, and the like can be corrected in addition to the magnification by controlling the deformation mechanism MAG. Furthermore, in step S3172, a high-order component of the overlay error can be corrected.

Subsequently, the process advances to step S309. In step S309, the curing device CU cures the imprint material on the substrate, and in step S310, a mold separation process is performed by the mold driving mechanism MDM. In step S311, whether the current shot is the final shot is determined. If it is determined that the current shot is not the final shot, the process returns to step S303, and the processes are repeated for the next shot. If it is determined that the current shot is the final shot, the controller CNT will control, in step S318, the substrate conveyance mechanism to unload the substrate, and end the imprint process.

Embodiment of Article Manufacturing Method

A pattern of a cured material formed by using an imprint apparatus is used permanently for at least some of various articles, or is used temporarily when manufacturing various articles. The articles include an electric circuit element, an optical element, a MEMS, a recording element, a sensor, and a mold. Examples of the electric circuit element are a volatile or nonvolatile semiconductor memory such as a DRAM, an SRAM, a flash memory, or an MRAM and a semiconductor element such as an LSI, a CCD, an image sensor, or an FPGA. An example of the mold is an imprinting mold.

The pattern of a cured material is used unchanged as a constituent member for at least some of the foregoing articles, or is temporarily used as a resist mask. The resist mask is removed after etching, ion implantation, or the like is performed in a substrate processing step.

Next, the article manufacturing method will be described. In step SA of FIG. 8, a substrate $1z$ which is a silicon substrate or the like on whose surface a processing target material $2z$ such as an insulator is formed is prepared, and next, an imprint material $3z$ is applied to the surface of the processing target material $2z$ by an ink-jet method. A state in which the imprint material $3z$ in the form of a plurality of droplets is applied onto the substrate is shown here.

Figure 8:
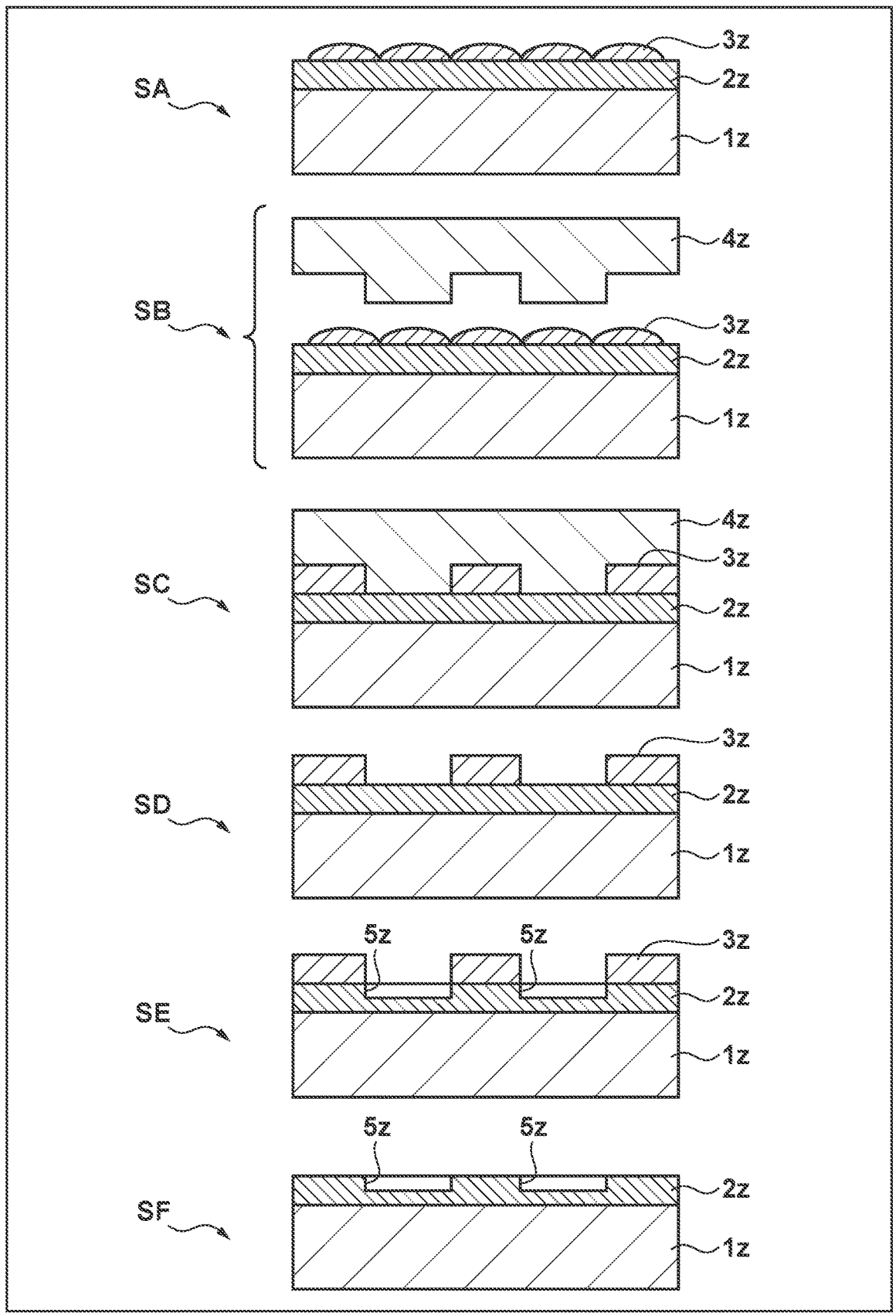
FIG. 8 is a view for explaining a method of manufacturing an article according to an embodiment.

As shown in step SB of FIG. 8, a side of an imprinting mold $4z$ on which its three-dimensional pattern is formed faces the imprint material $3z$ on the substrate. In step SC of FIG. 8, the substrate $1z$ to which the imprint material $3z$ has been applied and the mold $4z$ are brought into contact, and pressure is applied. Gaps between the mold $4z$ and the processing target material $2z$ is filled with the imprint material $3z$. When the imprint material $3z$ is irradiated with light as curing energy through the mold $4z$ in this state, the imprint material $3z$ is cured.

In step SD of FIG. 8, when the mold $4z$ and the substrate $1z$ are separated after the imprint material $3z$ is cured, a pattern of the cured material of the imprint material 3z is formed on the substrate 1z. The pattern of this cured product has a shape such that the concave portion of the mold corresponds to the convex portion of the cured product, and the convex portion of the mold corresponds to the concave portion of the cured product; that is, the three-dimensional pattern of the mold 4z is transferred to the imprint material 3z.

In step SE of FIG. 8, when the pattern of the cured material is etched as an etching resistant mask, portions out of the surface of the processing target material 2z where the cured material is not present or thinly remains are removed, and grooves 5z are achieved. In step SF of FIG. 8, when the pattern of the cured material is removed, it is possible to achieve an article in which the grooves 5z are formed on the surface of the processing target material 2z. The pattern of the cured product is removed here; however, the pattern of the cured product may be used as, for example, an interlayer dielectric film included in the semiconductor element or the like, that is, the constituent member of the article without removing it after processing.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-135069, filed Aug. 7, 2020, which is hereby incorporated by reference herein in its entirety.

What is claimed is:

1. An imprint apparatus that performs an imprint process of forming a pattern on a shot region of a substrate by curing an imprint material in a state in which the imprint material on the shot region of the substrate and a mold are in contact with each other, comprising:
   a mold holder configured to hold the mold;
   a deformation mechanism configured to deform a pattern region of the mold by applying a force to a side surface of the mold held by the mold holder; and
   a controller configured to:
   apply a setting load, based on a response property of the mold when the force is applied to the mold by the deformation mechanism, to the mold by the deformation mechanism before the mold and the imprint material are brought into contact with each other, and deform the pattern region of the mold by the deformation mechanism, after the mold and the imprint material have been brought into contact with each other, so as to reduce an overlay error between the shot region and the pattern region,
   wherein the overlay error is a difference between the shape of the shot region and the shape of the pattern region, and
      wherein the controller is configured to obtain the response property corresponding to the mold held by the mold holder from respective response properties obtained from a plurality of molds before the setting load is applied to the mold, or from a measurement result of detected deforming of the pattern region by the deformation mechanism so as to reduce an overlay error between the shot region and the pattern region in the imprint process on a first shot region.

2. The apparatus according to claim 1, wherein the controller is configured to determine the response property to be a property that indicates a relationship between a deformation amount of the mold and a driving force of the deformation mechanism in a state in which the mold and the imprint material are in contact with each other.

3. The apparatus according to claim 1, wherein the controller is configured to determine a value of the setting load based on a ratio of the response property of the mold held by the mold holder to a response property of a mold which serves as a reference.

4. The apparatus according to claim 3, wherein the controller is configured to determine a value of the setting load so that a driving direction will be constant when the deformation mechanism is to be driven to further reduce the overlay error between the shot region and the pattern.

5. The apparatus according to claim 1, wherein the controller is configured to perform a driving operation of the deformation mechanism, to reduce the overlay error between the shot region and the pattern region, that includes a first driving operation, which is performed to reduce a linear component overlay error, and a second driving operation, which is performed to reduce a non-linear component overlay error by using a remaining stroke after the first driving operation.

6. An imprint method of forming a pattern on a shot region on a substrate by curing an imprint material in a state in which the imprint material on the shot region of the substrate and a mold are in contact with each other, the method comprising:
   obtaining a response property of the mold when a force is applied to the mold by a deformation mechanism configured to deform a pattern region of the mold by applying the force to a side surface of the mold held by a mold holder;
   applying a setting load to the mold by the deformation mechanism based on the response property obtained before the mold and the imprint material are brought into contact with each other;

bringing the mold and the imprint material into contact with each other in a state in which the setting load is applied to the mold by the deformation mechanism; and deforming the pattern region by the deformation mechanism, after the mold and the imprint material have been brought into contact with each other, so as to reduce an overlay error between the shot region and the pattern region.

7. A method of manufacturing an article, comprising:

forming a pattern on a substrate by using an imprint apparatus defined in claim 1; and processing the substrate on which the pattern has been formed in the forming, wherein the article is manufactured from the substrate that has undergone the processing.

* * * * *